(12) United States Patent
Franceschini et al.

(10) Patent No.: US 8,868,978 B2
(45) Date of Patent: Oct. 21, 2014

(54) RECLAIMING DISCARDED SOLID STATE DEVICES

(75) Inventors: Michele M. Franceschini, White Plains, NY (US); Ashish Jagmohan, White Plains, NY (US); Luis A. Lastras-Montano, Cortlandt Manor, NY (US); Mayank Sharma, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 334 days.

(21) Appl. No.: 13/396,020

(22) Filed: Feb. 14, 2012

(65) Prior Publication Data
US 2013/0212427 A1 Aug. 15, 2013

(51) Int. Cl.
*G06F 11/00* (2006.01)
(52) U.S. Cl.
USPC .......................................................... 714/33
(58) Field of Classification Search
CPC ............ G06F 3/064; G06F 2212/7211; G06F 3/0644; G06F 2212/1036
See application file for complete search history.

(56) References Cited

U.S. PATENT DOCUMENTS

| | | | | |
|---|---|---|---|---|
| 7,251,458 | B2 * | 7/2007 | O'Connell | 455/90.1 |
| 7,340,581 | B2 | 3/2008 | Gorobets et al. | |
| 7,450,420 | B2 | 11/2008 | Sinclair et al. | |
| 7,934,072 | B2 * | 4/2011 | Hobbet et al. | 711/202 |
| 2002/0184432 | A1 | 12/2002 | Ban | |
| 2003/0014687 | A1 | 1/2003 | Wu | |
| 2007/0277066 | A1 | 11/2007 | Gajapathy et al. | |
| 2009/0089518 | A1 * | 4/2009 | Hobbet et al. | 711/155 |
| 2009/0172248 | A1 * | 7/2009 | You | 711/103 |
| 2010/0083244 | A1 | 4/2010 | Bothwell et al. | |
| 2011/0131368 | A1 * | 6/2011 | Lee et al. | 711/103 |
| 2011/0238903 | A1 * | 9/2011 | Ban | 711/103 |
| 2012/0066439 | A1 * | 3/2012 | Fillingim | 711/103 |
| 2012/0239855 | A1 * | 9/2012 | Tootoonchian et al. | 711/103 |

OTHER PUBLICATIONS

Krishnamoorthy, R. et al., "Error Control to Increase the Yield of Semiconductor RAM's" The 1989 IEEE/CAM Information Theory Workshop (1989) pp. 7-3.
Mielke, N. et al., "Bit Error Rate in NAND Flash Memories" IEEE 46th Annual International Reliability Physics Symposium (2008) pp. 9-19.
Heegard, C. et al., "On the Capacity of Computer Memory with Defects" IEEE Transactions on Information Theory (Sep. 1983) pp. 731-739, vol. IT-29, No. 5.
Finucane, H. et al., "Designing Floating Codes for Expected Performance" Communication, Control and Computing (2008) pp. 1389-1396.
Jiang, A. et al., "Floating Codes for Joint Information Storage in Write Asymmetric Memories" IEEE International Symposium on Information Theory (2007) pp. 1166-1170.
Gal, E. et al., "Algorithms and Data Structures for Flash Memories" ACM Computing Surveys (2005) pp. 138-163, vol. 37, No. 2.
Yaakobi, E. et al., "Multidimensional Flash Codes" Imprint (2009).
International Search Report dated May 9, 2013, issued in corresponding International Application No. PCT/US13/20470.

* cited by examiner

*Primary Examiner* — Charles Ehne
(74) *Attorney, Agent, or Firm* — Scully, Scott, Murphy & Presser, P.C.; Jennifer R. Davis, Esq.

(57) ABSTRACT

Discarded memory devices unfit for an original purpose can be reclaimed for reuse for another purpose. The discarded memory devices are tested and evaluated to determine the level of performance degradation therein. A set of an alternate usage and an information encoding scheme to facilitate a reuse of the tested memory device is identified based on the evaluation of the discarded memory device. A memory chip controller may be configured to facilitate usage of reclaimed memory devices by enabling a plurality of encoding schemes therein. Further, a memory device can be configured to facilitate diagnosis of the functionality, and to facilitate usage as a discarded memory unit. Waste due to discarded memory devices can be thereby reduced.

20 Claims, 5 Drawing Sheets

RECLAIMING DISCARDED SOLID STATE DEVICES

BACKGROUND

The present disclosure generally relates to a method of reclaiming discarded solid state devices, an apparatus for effecting the same, a memory chip controller configured to effect the same, and memory chips configured to effect the same.

Solid state electronic devices are of increasing importance in technology applications. Solid state electronic devices are found in virtually every electronic appliance. An undesired characteristic often affecting solid state technologies is that they are prone to degradation with time and use. Such degradation, and natural obsolescence due to Moore's law leads to discarding of such devices. No known solution for reducing such discarded solid state devices or systems exist.

For example, NAND/NOR flash solid state memory devices have already established a significant presence in consumer applications requiring non-volatile data storage. Flash memory devices as well as other emerging solid state memory devices (such as phase-change memory devices) are now on the verge of effecting a remarkable remake of the memory and storage subsystems in enterprise and consumer computing applications due to such features as reduced latency, reduced power consumption, higher density, and enhanced persistence.

A fundamental constraint that frequently arises in the usage of such memory devices is the limited endurance of such solid state memory devices. For example, latest NAND flash memory devices have an endurance specification of only 3,000-5,000 read and write cycles. Further, the number of read and write cycles in the endurance specification has been decreasing in latest technology generations employing smaller feature sizes.

Once a memory device has been cycled to a specified endurance limit, the memory device is treated as potentially unusable, and is commonly discarded. Such a memory device is typically physically removed from the system to avoid degradation of system performance. The discarded memory device can be replaced with a new memory device designed to perform the same function as the discarded memory device.

Solid-state devices may be discarded for other reasons as well. Surplus inventory including non-defective solid state devices that remain unsold for a commercially unacceptable time may be discarded as obsolete. Discarding such devices for any of the aforementioned reasons adds to a large quantity of potentially toxic electronic waste materials. The environmental hazard of such electronic waste materials has been globally recognized. While one way of reducing such waste materials is to recycle components of such devices, this process is generally destructive, and costs power and money.

SUMMARY

Discarded memory devices unfit for an original purpose can be reclaimed for reuse for another purpose. The discarded memory devices are tested and evaluated to determine the level of performance degradation therein. A set of an alternate usage and an information encoding scheme to facilitate a reuse of the tested memory device is identified based on the evaluation of the discarded memory device. A memory chip controller may be configured to facilitate usage of reclaimed memory devices by enabling a plurality of encoding schemes for use on memory chips. Further, a memory device can be configured to facilitate diagnosis of the functionality, and to facilitate further usage as a discarded memory unit. Waste due to discarded memory devices can be thereby reduced.

According to an aspect of the present disclosure, a method of determining an application for using a discarded electronic device is provided. The method includes the steps of: loading a discarded electronic device on a tester and testing the discarded electronic device for at least one performance parameter; determining, employing a computer device, a combination of an application that the tested discarded electronic device can be employed for, and a device operating method that enhances at least one aspect of performance of the tested discarded electronic device during use for the application; and providing an output including the tested discarded electronic device as a reclaimed electronic device and information identifying the combination.

According to another aspect of the present disclosure, an apparatus for identifying an application for using a tested electronic device is provided. The apparatus includes: a tester configured to load an electronic device and to test the loaded electronic device for at least one performance parameter; a computer device configured to determine a combination of an application that the loaded and tested electronic device can be employed for and a device operating method that enhances at least one aspect of performance of the tested loaded electronic device during use for said application; and a means for storing information identifying the loaded and tested electronic device as a reclaimed electronic device and information identifying the combination. The tested electronic device can be a discarded electronic device.

According to yet another aspect of the present disclosure, a memory chip controller is provided. The memory chip controller is configured to be in communication with at least one memory device and including circuitry capable of selecting one of at least two different coding methods, wherein the memory chip controller is configured to use one of the at least two coding methods on data that is communicated from, or to, each of the at least one memory device.

According to still another aspect of the present disclosure, a memory device is provided. The memory device includes at least one memory bank including an array of memory cells. The memory device is configured to operate in at least two operational modes including a standard mode in which data in the at least one memory bank is communicated to another chip through the bypassable internal memory chip controller and a recycle mode in which the data in the at least one memory bank is communicated to another chip without passing through the bypassable internal memory chip controller.

DETAILED DESCRIPTION

Figure 1:
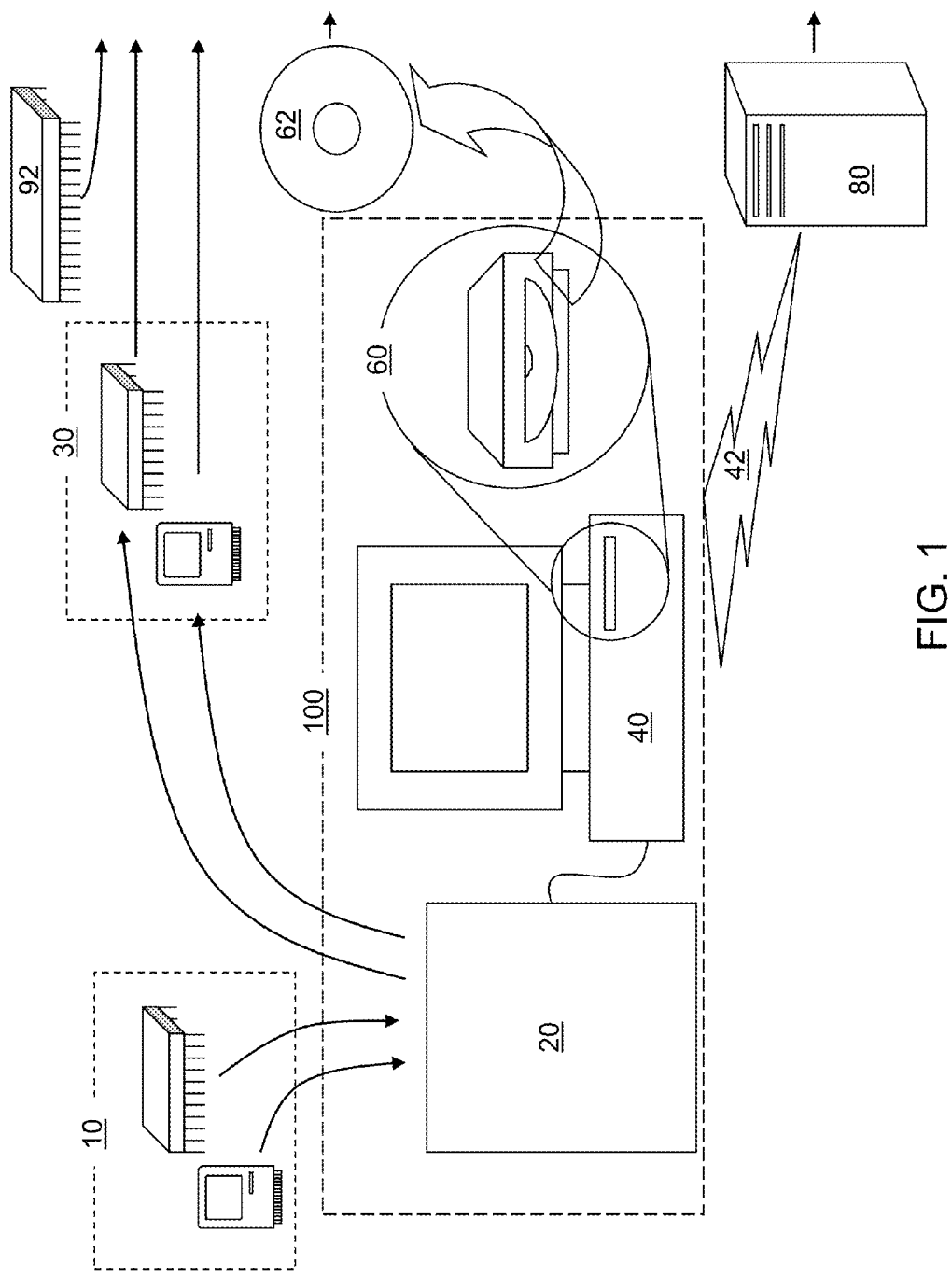
FIG. 1 is a schematic diagram illustrating an exemplary system including an apparatus for identifying an application for using a discarded electronic device according to embodiments of the present disclosure.

As stated above, the present disclosure relates to a method of reclaiming discarded memory devices, an apparatus for effecting the same, a memory chip controller configured to effect the same, and memory chips configured to effect the same, which are now described in detail.

As used herein, a "device" refers to any device configured to process any information and/or to store information in a non-transitory medium, and includes semiconductor devices as known in the art, devices based on nanoscale technology, and solid state optical devices.

As used herein, a "memory device" refers to any device configured to store information in a non-transitory medium.

As used herein, a "discarded" device refers to a device on which a decision has been made, either by a person or by computer algorithm, not to use said device for a purpose for which said device was originally manufactured. Use of the discarded electronic device may have been discontinued for the purpose for which the device was originally designed, or the discarded electronic device may never have been used for the purpose for which the device was originally designed.

As used herein, a "solid state device" or a "solid state electronic device" refers to any device "built entirely from solid materials and in which the electrons, or other charge carriers, are confined entirely within the solid material," and is configured to process information and/or to store information.

As used herein, a "coding method" refers to any of an encoding method and a decoding method.

As used herein, a "reclaimed device" is a device that has at least one identified purpose for which the device can be operated for with full functionality required for the identified purpose.

A memory device is typically provided in the form of a semiconductor chip. A memory device that has been discarded due to production defects, endurance limits, surplus inventory, or any other reason may be reclaimed provided that such a memory device still provides at least some level of limited functionality. The limited level of functionality does not need to meet the specification that the memory device was originally designed for.

For the purpose of the present disclosure, it has been recognized that the endurance and performance specifications of non-volatile memory devices are not hard limits. For example, a memory that is cycled to its specified limit for the total number of read operations and/or write operations does not necessarily lose the ability to store data in a stable manner. Instead, as a memory device is cycled over the specified limit for the total number of read operations and/or write operations, the retention time of the memory device decreases, and the probability of bit errors increases smoothly. Thus there is a trade-off between retention/error performance and endurance, i.e., the useful lifespan of a memory device. Similarly, a memory device with production defects may simply have a reduced data storage capacity or an increased bit-error rate.

Further, it has been recognized, for the purpose of the present disclosure, that the application space in which memory devices are used is non-uniform in terms of performance requirements. Thus, a memory device which fails to meet the requirements for a given application (e.g., an enterprise server application) may, nevertheless, be useful for other applications (such as a consumer application).

In the present disclosure, advanced mathematical techniques including performance enhancing algorithms, as known in the art, can be employed to encode data in a discarded memory device in a manner that enhances performance of the discarded memory device. Such advanced mathematical techniques, known in the art include endurance coding and error-control coding.

By applying such advanced mathematical techniques, a discarded device properly encoded with a performance-enhancement algorithm can provide an enhanced level of performance despite a lower level of performance of such a discarded memory device in a previously unencoded state. Exemplary performance attributes of the discarded memory that mathematical techniques can enhance include retention time, endurance, bit-error characteristics, latency, and power consumption. Further, selection of an encoding scheme allows various aspects of performance enhancement to be traded off at the expense of other aspects of performance enhancements.

Thus, a method is provided by which discarded memory devices can be efficiently and non-destructively reclaimed and reused for an original purpose of the discarded memory device prior to discarding, or for a purpose similar to, or different from, the original purpose for which the discarded memory device was previously used. Further, a system is provided for effecting efficient and non-destructive reclaiming and reuse of a previously discarded memory for a purpose different from the original purpose for which the discarded memory device was previously used. In addition, a memory chip controller and/or a memory device can be altered to accommodate and facilitate the reclaiming process described above.

In the method, discarded memory devices are tested and reused for a purpose verified to be compatible with the most up-to-date performance level or projected performance level based on the test data. The purpose for which a tested discarded memory device is employed can be a different from the original purpose for which the tested discarded memory device was employed prior to discarding. In some cases, if the functionality of the tested discarded memory device is compatible with the original purpose for which the tested discarded memory device was employed in a computing system, the functionality of the tested discarded memory device can be employed again in the computing system from which it was previously removed, or in a computing system similar to the computing system from which it was previously removed.

Figure 2:
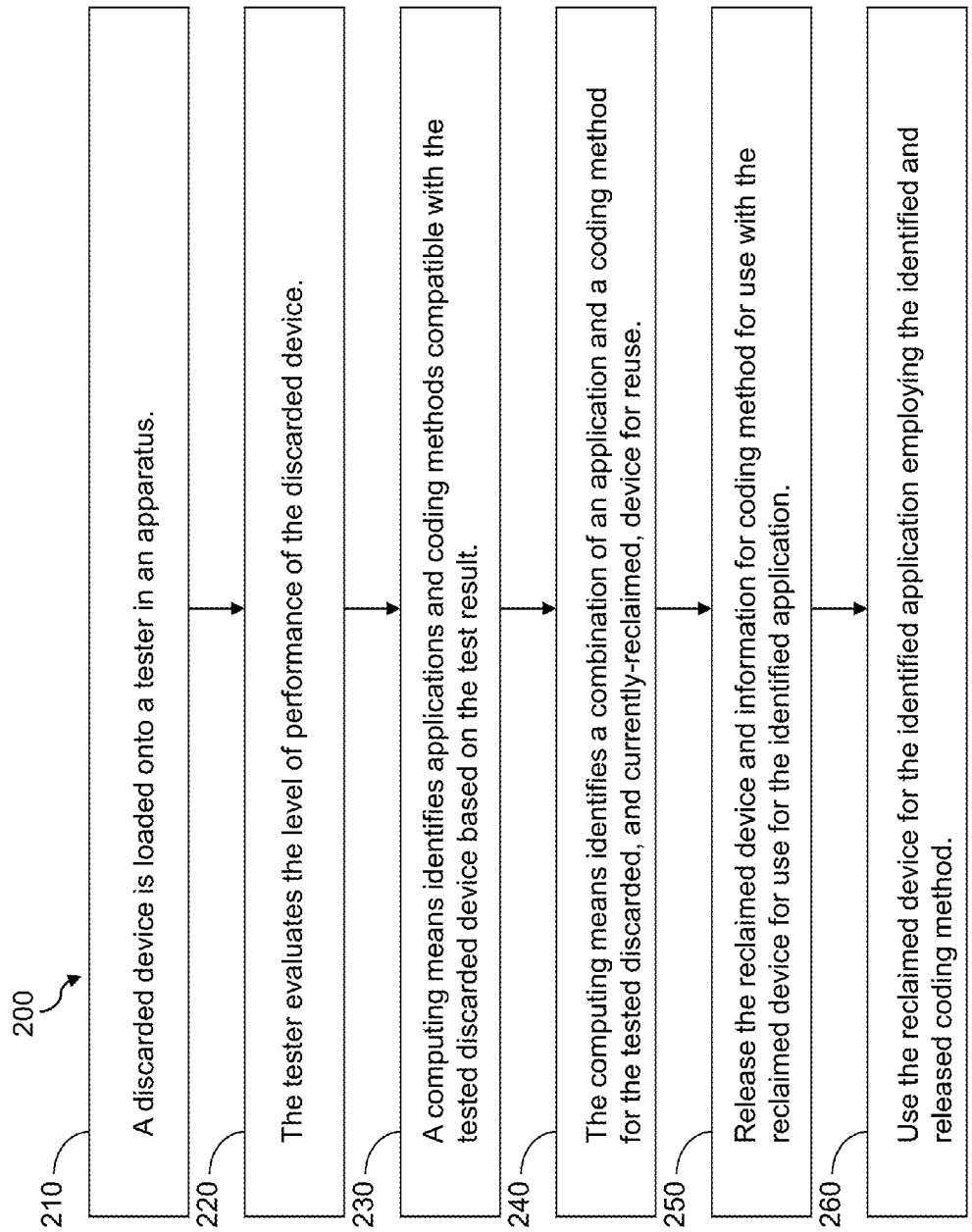
FIG. 2 is a flowchart illustrating a method for identifying an application for using a discarded electronic device according to embodiments of the present disclosure.

The method of reclaiming discarded memory devices can be systematically implemented employing an exemplary system illustrated in FIG. 1 and the steps shown in the flow chart 200 in FIG. 2. The exemplary system includes an apparatus 100 for identifying an application for reusing at least one discarded electronic device 10. The applications for reusing the at least one discarded electronic device 10 include, but are not limited to, enterprise storage, consumer storage (e.g. storage of music, video, e-mail) on tablets, laptops, PCs, digital picture frames, USB keys, camera memory cards (e.g. SD cards), caches of storage drives, data sensors. Non-limiting examples of the device types of the at least one discarded electronic device 10 include NAND flash, NOR flash, PCM devices, STT-RAM devices, DRAM devices using a variety of interfaces such as LPDDR2, DDR2, DDR3, NOR flash interface, ONFI, toggle mode interface, multimedia card interface, and, in general, modules combining multiple such devices. At least one discarded electronic device 10 is provided as an input to the exemplary system, and a combination of at least one reclaimed electronic device 30, which is identical to the at least one discarded electronic device 10, and information and/or hardware needed to operate the at least one reclaimed electronic device 30 in a reclaimed mode is generated as an output of the exemplary system.

Referring to step 210 of FIG. 2, the apparatus 100 takes in at least one discarded electronic device 10 as an input. Each discarded electronic device 10 may have been discarded for any of the reasons described above, e.g., after usage in a functional computing system that includes enterprise servers and consumer electronic devices (including cameras, portable communication devices, and low-end computers). In one embodiment, the at least one discarded memory device 10 can be at least one solid state memory device.

The at least one device 10 can be a memory device, or can be a non-memory device such as a processor unit, or a hybrid unit including an embedded processor and embedded memory blocks. The at least one device 10 can include a packaged semiconductor chip that can be, or has been, mounted on a motherboard by soldering or insertion, or can include a removable memory device such as a flash memory module that can be inserted and removed into a computing device or any data processing device such as a digital camera. The at least one device 10 is mounted onto a tester 20.

Referring to FIG. 1, the apparatus 100 includes a tester 20 configured to receive and load the at least one discarded electronic device 10, to test the loaded at least one discarded electronic device 10 for at least one performance parameter, and to generate test data including at least one measured performance parameter, i.e., measured values for the at least one performance parameter. The at least one performance parameter can include, but is not limited to, endurance, retention time, response time, error rate, a total number, or a fraction of, failed memory blocks, and functionality of physical components.

The tester 20 may be configured to test one discarded electronic device 10 at a time, or may be configured to simultaneously test multiple discarded electronic devices 10 at a time. In one embodiment, a single discarded electronic device 10 is tested at a time. In another embodiment, multiple discarded electronic devices 10 are tested, tracked, and processed simultaneously. In one embodiment, the at least one discarded electronic device 10 can be at least one semiconductor chip.

Referring to step 220 of FIG. 2, the tester 20 evaluates the level of performance of a loaded discarded electronic device 10 for at least one parameter. The at least one parameter is selected to measure the level of performance of the discarded electronic device 10 in at least one aspect. Thus, the tester 20 evaluates the quality of functionality of each of the at least one discarded electronic device 10, i.e., the level of performance degradation of each discarded electronic device 10 in order to determine the operating characteristics of the at least one discarded electronic device 10, and to subsequently determine its suitability as a candidate for reclamation. In an example embodiment, the discarded electronic device is a processor or memory device, and the tester performs checks for physical integrity of the signaling pins of the device by transmitting and receiving electrical signals over those pins. In another embodiment, the discarded electronic device is a memory device, and the tester reads and writes data from the device, in order to measure performance and reliability attributes such as device bit-error rate, which is measured by repeatedly writing pseudo-random patterns to the memory, retrieving the patterns and testing for errors; device retention, which is measured by performing an extended error rate measurement by subjecting the contents to an artificial aging process achieved by applying a thermal treatment as per standard specifications; the position of bad blocks, which is assessed by performing a device error rate measurement targeted to each block (or to a statistically meaningful set of blocks); and device read and write latency, which is measured by assessing the minimum time it takes to read/write multiple blocks of data to/from the device.

In one embodiment, the at least one discarded electronic device 10 can be at least one discarded memory device. In this case, the at least one performance parameter can include, but is not limited to, a remaining lifetime of each of the at least one discarded memory device, a retention time of each of the at least one discarded memory device, a response time of each of the at least one discarded memory device, a total number, or a fraction of, failed memory blocks in each of the at least one discarded memory, and functionality of physical components, such as pins, in each of the discarded memory device. At the tester 20, the evaluation process may test various aspects of performance of the discarded memory device, which can include, but are not limited to, retention time, endurance, bit-error characteristics, latency, power consumption, and memory capacity. Retention time refers to the average duration between the time when a bit/symbol of information has been written to a memory device and the time until when the bit/symbol can be read from the memory device with the required level of reliability. Endurance refers to the average number of times information can be written to a typical cell or storage element of a memory device before the cell or storage element can no longer store information reliably. Bit-error characteristics refer to the statistical properties relating to the probability that a bit written to a cell or storage element of a memory device can be correctly read. Latency refers to the average duration between the time when a communication information or control request is made and the time when the request is successfully completed. Power consumption refers to the average amount of power consumed per request for information. Memory capacity refers to the number of information bits/symbols that can be stored on a memory and read within the stipulated reliability criterion In a non-limiting exemplary embodiment, a NAND flash memory device can be tested for basic functionality, such as requesting identification of the NAND flash memory device and performing standard diagnosis of the health of physical pin connections. Subsequently at the tester 20, the NAND flash memory device can undergo a sequence of minimally invasive tests which are meant to assess key device attributes. Some of exemplary attributes include device bit-error rate, device retention time, and the position of bad blocks within the memory device. The device bit-error rate can be measured, for example, by repeatedly writing pseudo-random patterns to the memory device, retrieving the patterns stored in the memory device, and testing for errors by comparing the read pattern with the original pattern. The device retention can be measured by performing an extended error rate measurement in which the contents of the memory device are subjected to an artificial aging process, which can be provided, for example, by applying a thermal treatment to simulate passage of time. The position of bad blocks can be assessed by performing a device error rate measurement targeted to each memory block of the memory device (or to a statistically meaningful set of memory blocks).

Referring to FIG. 1, the apparatus 100 further includes a computer device 40, which includes a programmed processor unit. The computer device 40 can be a stand-alone computing device, such as an enterprise server or a personal computer, in communication with the tester 20. Alternately, the computer device 40 can be a computing device integrated as a component of the tester 20 itself.

The computer device 40 can include a database, which lists specifications for an original application that each type of tested memory chips 10 is designed to meet upon manufacturing. Alternately, the computer device 40 can be in communication with another computer device (not shown) hosting the database. The communication between the computer device 40 and the other computer device may be effected by wired or wireless communication.

The database includes a list of alternative applications, for each tested discarded electronic device 10, that does not require the full performance level of the tested discarded electronic device 10 as initially targeted at the time of manufacturing. Each alternate application is an application that the tested discarded electronic device 10 can be employed for, given the current status as a discarded electronic device, i.e., as a device of which use has been discontinued for the purpose for which the device was originally designed, or which has never been used for the purpose for which the device was originally designed as defined above.

Thus, the database lists alternative applications for memory chips 10 of each type that do not meet the standard for the specifications for the original application. For example, for each range of performance level that enables a potential reuse of a tested memory chip 10 for an application, i.e., use, the corresponding use can be tabulated in the database. Multiple applications, which do not require the performance level of a memory chip corresponding to the original application that the memory chip was previously used for, or was designed for (whether or not the memory chip was actually used or not for that application), can be listed in the database. In some embodiments, the range of performance levels for the multiple applications can overlap with one another. Examples of applications with corresponding performance requirements include: (1) mp3 storage, requiring: low bandwidth, medium low storage requirement, low number of additional write/erase cycles, long retention; (2) computer storage accelerating operating system loading: requiring high bandwidth, low number of additional write/erase cycles, low write bandwidth, medium retention; and (3) USB key, requiring low bandwidth, low number of write/erase cycles, high reliability, long retention. In general, any application that does not require state of the art memory can be potentially be an alternative application.

In one embodiment, each of the alternate applications can be an application that is different from the application for which a tested discarded electronic device 10 was originally designed for, i.e., an application different from the original application before the tested discarded electronic device 10 was "discarded." In another embodiment, if the testing shows a performance level that is on par with the performance level for which a tested discarded electronic device 10 was originally designed for, the tested discarded electronic device 10 can be employed for the original purpose.

Further, the database includes a list of encoding methods. Any encoding method as known in the art can be on the list provided that the encoding method is compatible with the type of devices that the tested discarded electronic device 10 belongs to. Non-limiting examples of encoding methods include algorithms, embodied in program codes, that can trade off storage capacity for redundancy, codes that tradeoff storage capacity for number of write cycles, codes that deal with known and unknown I/O interface failures. For example, NAND flash will have a high bit error rate after cycling in the course of usage. Such NAND flash can then be used with a low rate error correcting code which reduces capacity but ensures reliability in a lower end application such as a digital picture frame or RFID tags. As another example, retention time is decreased in a NAND flash when it is cycled excessively, and such devices can then be recycled for use as caches in drives. As a third example, a DRAM device with a broken I/O pin can be encoded such that data is re-encoded so as to send the data through the remaining pins.

Encoding refers to transformation of an original set of bits into a transformed set of bits such that even if an error occurs in the transformed set of bits, the data can be recovered under certain conditions. In embodiments in which the tested discarded electronic device 10 is a memory device, exemplary encoding methods include, but are not limited to, error correction code (ECC) methods, low density parity check code (LDPCC) methods, endurance encoding methods, and constrained encoding methods. The ECC methods provide tradeoffs among memory capacity, bit-error rates, and the retention time of the tested discarded electronic device 10. The LDPCC methods provide enhanced error correction protection in high noise situations, but tend to require a large access granularity. The endurance encoding method provides a tradeoff between memory capacity and cycling endurance. Endurance encoding reduces wear of a memory device, and use of the endurance encoding can accomplish an increased device lifetime through reduction in memory capacity. The constrained encoding methods provide tradeoffs between write power consumption and memory capacity. The constrained encoding can constrain the level of maximum power consumption that page encoding requires.

Devices other than memory devices can be employed for the at least one discarded electronic device 10. In one embodiment, an electronic device in the form of a single package (a single chip) that includes a compute processor, at least one memory controller, and a memory unit can be employed as the at least one discarded electronic device 10. This package is then an electronic device that can be recycled as a whole unit. The memory unit can utilize a combination of different technologies including memory banks that can wear out with use (for example NAND flash). In this example, the memory controller is configurable so that different tradeoffs can be selected with the use of the memory. For example, this electronic device may have been used in a high end cell phone with complex video and audio capture and processing functionality, but after flash wear, the phone is discarded. The memory controller within the package is then reconfigured so that a smaller capacity and/or slower memory access time results, but the reliability of the data is still guaranteed. The resulting electronic device can then be packaged within a cell phone that has lower functionality capabilities but can still operate reliably.

Referring to step 230, during the operation of the system illustrated in FIG. 1, the computer device 40 identifies applications and encoding methods compatible with the tested discarded electronic device 10 based on the test result that the tester 20 generates. Thus, once the tester 20 provides the measured values for the at least one performance parameter, the computer device identifies a subset of at least one alternate application from the list of alternate applications so that each alternate application in the subset is compatible with the current performance level, characterized by the measured values for the at least one performance parameter, of the tested discarded electronic device 10.

Further, a subset of the encoding methods in the list in the database is identified to select a subset of encoding methods that can be employed to enhance performance of the tested discarded electronic device 10 given the measured values for the at least one performance parameter.

Thus, theoretically possible use of the tested discarded electronic device 10 is categorized and classified at step 230 in terms of potential application areas and a set of remedial measures/techniques (encoding methods). The correlation between the potential application areas and the remedial measures is established at a subsequent step.

Referring back to FIG. 1, the computer device 40 is configured to determine, i.e., to identify, a combination of an application and a device operating method that can be employed for the tested discarded electronic device 10. In one embodiment, the device operating method includes at least one of an encoding method for storing data in the tested discarded electronic device 10 and a decoding method for retrieving data stored in the tested discarded electronic device 10. The application in the combination is selected from among the subset of the at least one alternate application identified at step 230 in FIG. 2. Further, the coding method is selected so that at least one aspect of performance of the tested discarded electronic device 10 is enhanced during use of the tested discarded electronic device 10 for the application in the identified combination. If multiple different combinations of an application and an accompanying coding method are possible based on the test data generated from the tester, the multiple different combinations can be compared among one another based on a predefined selection algorithm, which can be based on economic and/or environmental considerations.

In an exemplary embodiment, the discarded electronic device can be a memory device that was previously used in an enterprise and/or storage system, and the multiple different alternate applications may include use of the device in digital photo frames (desirable attributes include low term data retention (the frame is plugged), moderate error rate requirements, moderate size requirements, minimal endurance requirements, and the latency requirements are flexible); mass storage archival applications (desirable attributes include high-capacity, minimal cycling endurance requirements, very long retention requirements, strict error-rate requirements and relaxed power budget); and RFID applications (desirable attributes include low capacity, long retention period, strict power constraints). In this case, the selection algorithm evaluates capacity, retention, error-rate, endurance and latency of the discarded electronic device, and determines which application the device is most economically suited for. Thus, for example, if the discarded electronic device has high capacity, high retention and low error-rate, the selection algorithm may select the mass-storage application, since that application will utilize the capacity of the device to a greater extent than the other two alternate applications. In another embodiment, the selection algorithm may be applied to a large number of tested discarded electronic devices and may classify the devices into three classes, one for each alternate example application, such that each class contains at least a pre-determined minimum number of discarded electronic devices. Other selection algorithms similar in nature to the algorithms discussed above may also be employed.

In one embodiment, the computer device 40 can identify the combination by comparing the test data with contents of the database that is loaded onto, or accessed by, the computer device 40. As discussed above, the database includes information identifying at least one application for a device type of the discarded tested device 10 and a corresponding requirement for the at least one performance parameter. The identified combination of an application and an coding method, if used on the tested discarded electronic device 10, enables the tested discarded electronic device 10 to meet the requirement for the at least one performance parameter for the application.

In one embodiment, all parameters in the requirement are included among the at least one performance parameter that the tester 20 tests on the tested discarded electronic device 10 at step 220 of FIG. 2.

Further, the computer device 40 is configured to select the coding method in the identified combination from a plurality of coding methods compatible with use in the tested discarded electronic device for the application in the identified combination. The computer device 40 can be configured to make this selection based on projected performance enhancement that is estimated to result from each of the plurality of coding methods that can be applied to the tested discarded electronic device.

Referring to step 240, the computer device 40 determines, i.e., identifies, a combination of an application and a coding method for the tested discarded electronic device 10 for reuse by utilizing the capabilities built therein as described above. Once the combination of the application and the accompanying coding method is determined, the tested discarded electronic device 10 is identified as a reclaimed electronic device 30 because the capability to use the tested discarded electronic device 10 for a new application, which may be different from the original application for which the discarded electronic device 10 was previously deemed to be unfit for, is established.

In one embodiment, the coding method in the determined combination can include, but is not limited to, a set of methods for enabling the coding method. The set of methods can include a first method for encoding data to be stored in the tested discarded electronic device, a second method for storing the encoded data in the tested discarded electronic device, a third method for retrieving the stored encoded data from the tested discarded electronic device, and a fourth method for decoding the retrieved encoded data.

In one embodiment, the computer device 40 can be configured to receive, as an external input, at least one data input that defines a range of performance specification for at least one application. The external input may provide a constraint on at least one performance parameter for reuse of the tested discarded electronic device 10. For example, the at least one performance parameter can be a bandwidth of communication, power consumption, latency of a memory device, and/or the capacity of a memory device. The selection of the combination can be responsive to the external input. The at least one input may, or may not, be added to the database. Further, the computer device 40 can be configured to identify the combination from among a group of applications including the at least one application and other applications in the database.

For determination of the combination, for example, the computer device 40 can combine each alternate application within the subset of at least one alternate application as identified at step 230 with each coding method within the subset of at least one coding methods as identified at step 230 under the constraint of the test data generated at step 220, and then determine projected performance level of each combination. In one embodiment, the various performance characteristics can be combined employing a scoring system to generate a value that indicates the desirability of each combination. In another embodiment, the various performance characteristics can be evaluated to screen out combinations that do not meet at least one predetermined criterion for reuse of the reclaimed electronic device 40. In an exemplary embodiment, all pairs of chips and applications can be examined, and the method for determining the score associated with a chip and an application can include a determination on if the chip meets all the requirements associated with the application or not. In additional embodiments, the overhead, for example the coding overhead required to guarantee meeting the requirements of an application is used as a factor to determine a score.

For any candidate alternate application, selection of a coding method can be made from the subset of the coding methods identified at step 230, i.e., from a family of available coding strategies. The selection of the coding method can be responsive to the target application, i.e., the alternate application under evaluation by the computer device. In case the reclaimed electronic device 30 is a memory device, the selection of the coding method can also be responsive to a measured error rate in the test data, a measured data retention time in the test data, and a malfunction detected during the test at step 220.

Selection of the combination can be made based on a cost-benefit analysis for each evaluated combination in which feasible alternatives are considered. Also, the selection algorithm can be biased for economic considerations and/or environmental considerations.

In one embodiment, the reclaimed electronic device 30 is a memory device. Examples of alternate applications include, but are not limited to, use for digital photo frames, use for mass storage archival applications, and used for radio frequency identification (RFID). Use for digital photo frames requires long term data retention, moderate error rate requirements, moderate size requirements, and minimal endurance requirements. Use for mass storage archival applications requires minimal cycling endurance, very long retention time, minimal error-rate, and relaxed power constraints. Use for RFID applications requires low capacity, long retention time, and strict power constraints.

Referring back to FIG. 1, the exemplary system can further perform the steps of generating and storing information identifying the coding method as determined at step 240 of FIG. 2. Thus, the exemplary system provides an output including the tested discarded electronic device 10 as a reclaimed electronic device 30 and information identifying the coding method as determined at step 240 of FIG. 2.

The computer device 40 can be configured to identify another device 92 that can be employed in conjunction with the determined combination such that the other device 92 and the tested discarded electronic device 10, i.e., the reclaimed electronic device 30, are in communication with each other.

The computer device 40 can output a combination of an application and an accompanying coding method. Multiple combinations can be produced as an output if a subsequent selection of a combination can be made from among the multiple combinations. In one embodiment, the combination, or the multiple combinations, can be an input to a machine (not shown), which is another tester that implements the coding method and verifies that the reclaimed electronic device 30 meets a new set of specification metrics for the identified alternate application.

In one embodiment, the computer device 40 can be configured to store information on the identity of the identified other device 92, for example, within the reclaimed electronic device 30 or on a portable non-transitory data storage medium 62 such as a CD ROM or a DVD ROM. The data storage in the portable non-transitory data storage medium 62 can be effected, for example, employing a data writing device 60, which can be, for example, a CD ROM drive or a DVD ROM drive. The data writing device 60 can be a part of the apparatus 100, and may, or may not be, an integral part of the computer device 40.

In another embodiment, the computer device 40 can be configured to communicate to another computer device 80 the information on the identity of the identified other device 92 so that the user of the reclaimed electronic device 30 can obtain a physical unit of the identified other device 92 for use in conjunction with the reclaimed electronic device. The communication 42 between the computer device 40 and the other computer device 80 can be effected by wired communication, wireless communication, or physical transfer of another portable non-transitory data storage medium (not shown).

In one embodiment, a physical unit of the other device 92 or an instruction to obtain and to use a physical unit of the other device 92 can be generated from the system as a part of the output.

In one embodiment, the tester 20 can be configured to test memory devices, and the computer device 40 can be configured to identify, as the other device 92, a memory chip controller compatible with the coding method in the determined combination.

Referring to step 250, the reclaimed electronic device 30 and information for the coding method in the combination as determined at step 240 can be released for use with the reclaimed electronic device 30 for use of the identified application in the combination. Thus, a high-quality restored memory device can be provided along with its storage and application specification for reuse.

If the reclaimed memory device 30 is reconfigured to implement the coding method in the combination identified at step 240, the output from the system of FIG. 1 can be in the form of a reclaimed electronic device 30 that is configured for an application that is different from the application for which the discarded memory device was originally configured.

If the information for the coding method is stored in the reclaimed memory device 30 or in a portable non-transitory data storage medium 62 or in another computer device 80, the output from the system of FIG. 1 can be in the form of a combination of the physical hardware of a reclaimed electronic device 30, i.e., a previously-discarded and currently-reclaimed memory device, and an accompanying software that enables coding of the reclaimed electronic device 30 for an application that is different from the application for which the discarded memory device was originally configured.

Referring step 260 in FIG. 2, reclaimed electronic device 30 can be used for the identified application employing the identified coding method.

The advantages of this method are manifold. First, the wastage of resources and physical devices, which are discarded merely because the physical devices longer meet their stated quality specification applied at the time of their production, can be significantly reduced. Many discarded electronic devices can be reused, after undergoing a restoration process described above. The reclaimed electronic devices 30 can be employed in the same role, i.e., for the same application, as determined at the time of production but at a different level of performance, or in a different role, i.e., for a different application, requiring different performance specifications.

Figure 3:
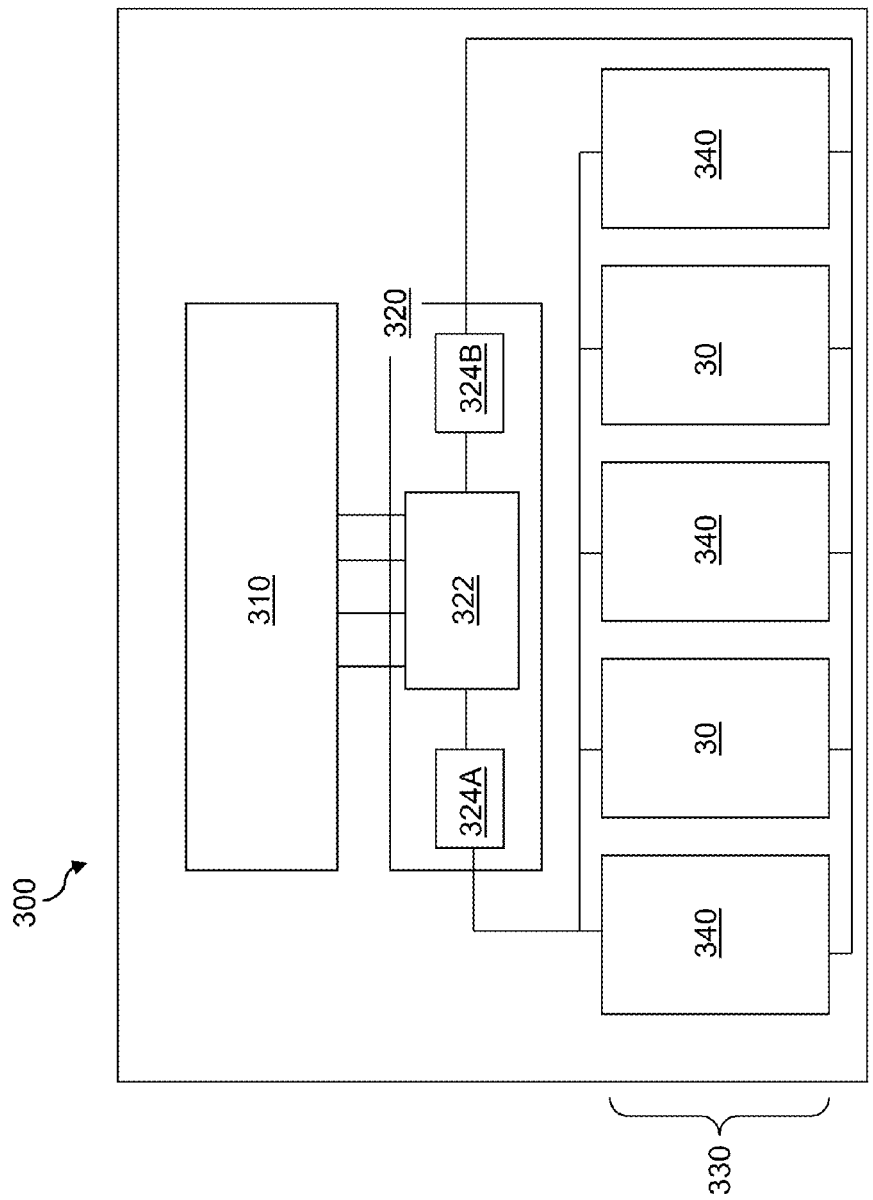
FIG. 3 is a schematic diagram illustrating a system including a memory chip controller according to an embodiment of the present disclosure.

Referring to FIG. 3, a system 300 including a memory chip controller 320 and at least one memory device 330 is illustrated. Each of the at least one memory devices 330 can be discrete semiconductor chips. The memory chip controller 320 determines how data is read from and written to the at least one memory device 330. The memory chip controller 320 includes an electronic circuit capable of selecting one of at least two different coding methods. Specifically, the memory chip controller 320 is configured to use one of the at least two coding methods on data that is communicated from, or to, each of the at least one memory device 330.

If the at least one reclaimed electronic device that has been reclaimed employing the method described in FIG. 2 is a memory device, i.e., if a reclaimed electronic device is a reclaimed memory device, the memory chip controller 320 facilitates the use of such at least one reclaimed memory device 30 by providing multiple coding methods for the at least one reclaimed memory device 30.

The system 300 includes a memory hosting hardware capable of accepting at least one reclaimed memory device 30 of FIG. 1 as a memory device among the at least one memory device 330. The at least one memory device 330 includes at least one reclaimed memory device 30, and may, or may not, contain one or more non-reclaimed electronic devices 340, i.e., memory devices that meet the specification upon manufacturing and have not been previously used.

The system 300 can further include a processor unit 310 that is in communication with the memory chip controller 320. Each of the at least one memory device 330 can be in communication with the processor unit 310 through the memory chip controller 320.

For communication with each of the at least one reclaimed memory device 30, a plurality of coding methods are available to the memory chip controller 320 through the hardware of a plurality of coder units (324A, 324B), i.e., at least two coder units that can be at least two encoder units or at least two decoder units. The memory chip controller 320 further includes a memory coding switch 322, which selects one of many available coding methods, which are available from the at least two coder units (324A, 324B), for the at least one reclaimed memory device 30 by setting a communication path between the memory coding switch 322 and the at least one reclaimed memory device 30 to include only one of the at least two coder units (324A, 324B).

In one embodiment, the memory chip controller 320 can be configured to select one of the at least two different coding methods in response to an output from a test operation performed on the discarded memory device 10 at a tester 20 in FIG. 2. The test operation measures at least one physical parameter of the discarded memory device 10 as described above. Further, the memory chip controller 320 can be configured to select one of the at least two different coding methods in response to communication with the discarded memory device 10, which can be transmitted during the testing on the tester 20.

In one embodiment, each of the at least two coder units (324A, 324B) employ different coding schemes based on different coding algorithms, and the memory chip controller 320 is configured to select one of the at least two coder units (324A, 324B) to communicate with each of the at least one reclaimed memory device 30.

In one embodiment, the memory chip controller 320 is configured to select a communication path to each of the at least one reclaimed memory device 30 to include a single coder unit (324A or 324B) selected from the at least two coder units (324A, 324B) based on an coding scheme employed in each of the at least one reclaimed memory device 30. The coding scheme can be the same as the coding method in the combination determined at step 240 of FIG. 2.

In one embodiment, the memory chip controller 320 can be configured to change a communication path to pins on which a memory device (one of 330) is mounted from a path including one (324A or 324B) of the at least two coder units (324A, 324B) to another path including another (324B or 324A) of the at least two coder units (324A, 324*b*) in order to enable use of a reclaimed memory device 30, based on a coding scheme employed in the reclaimed memory device 30. The coding scheme can be the same as the coding method in the combination determined at step 240 of FIG. 2.

In one embodiment, the at least one memory device 330 can include at least two memory devices, and the memory chip controller 320 can be in communication with a first subset of the at least two memory devices through one (324A or 324B) of the at least two coder units (324A, 324B), and is in communication with a second subset of the at least two memory devices through another (324B or 324A) of the at least two coder units (324A, 324B).

In one embodiment, the two coder units are physically implemented as a single coding unit that whose operation can be parametrized by an input signal. For example, the coding unit can generate more check symbols at the cost of memory capacity which would enable it to correct more errors.

Figure 4:
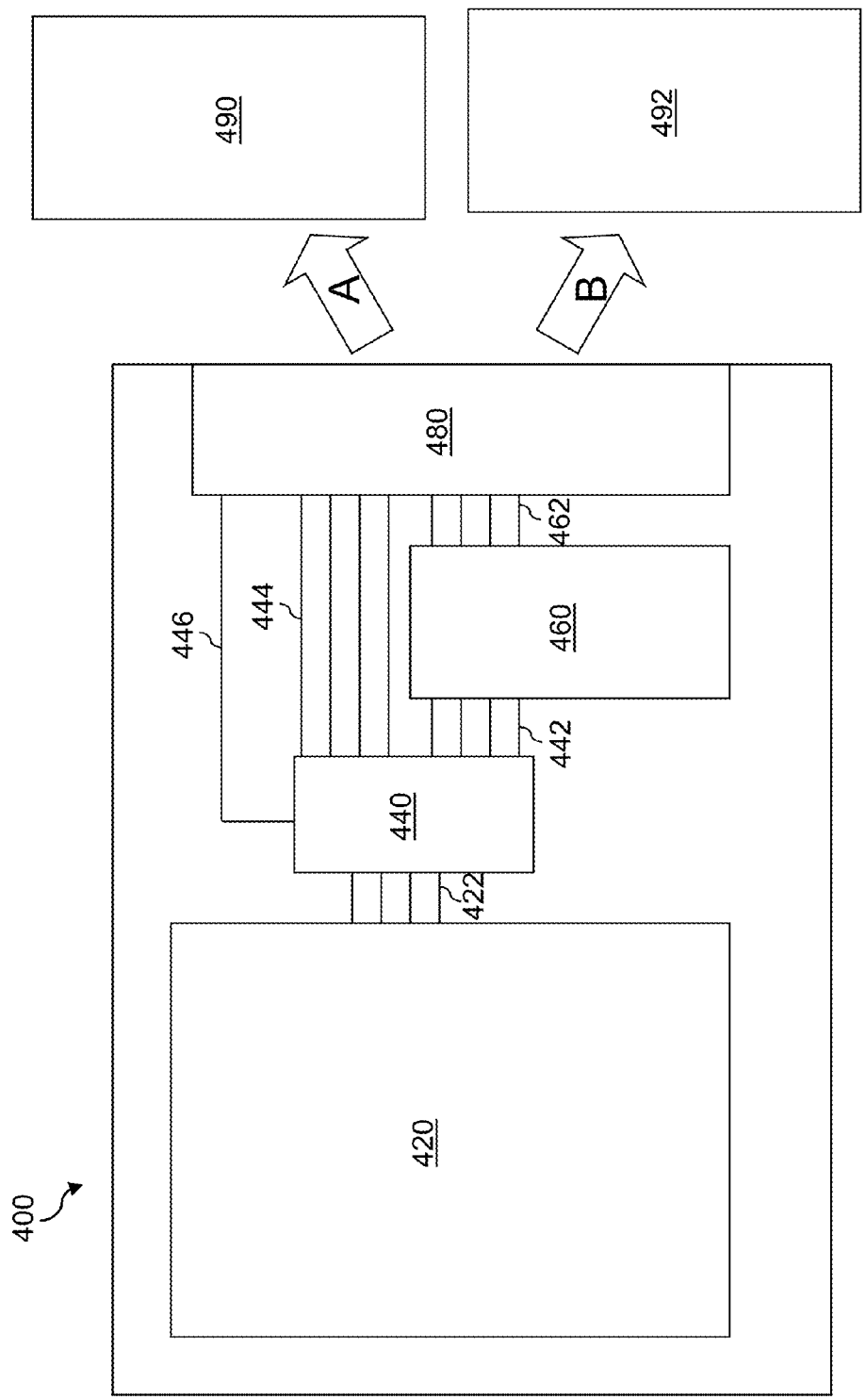
FIG. 4 is a schematic diagram illustrating a memory device that can be connected to a processor unit or an external memory chip controller according to an embodiment of the present disclosure.

Referring to FIG. 4, a memory device 400 that can be connected to a processor unit 490 or an external memory chip controller 492 is illustrated. The memory device 400 includes at least one memory bank 420 including an array of memory cells, a bypassable internal memory chip controller 460, a set of input/output pins 480, and a control switch 440. The control switch 440 controls routing of signals in the memory device 400, which is effected by various signal paths (422, 442, 444, 446, 462). The bypassable internal memory chip controller 460 is configured to be in communication with the at least one memory bank 420 and the set of input/output pins 480 while the control switch is in one state, and is configured to be electrically disconnected from the at least one memory back 420 while the control switch is in another state. The at least one memory bank 420 can include any type of solid state memory device known in the art.

Each of at least one memory bank 420 includes an array of memory cells. The memory device 400 is configured to operate in at least two modes of operation including a standard mode and a reclaimed mode. In the standard mode, data in the at least one memory bank 420 is communicated to another chip (such as the processor unit 490) through the bypassable internal memory chip controller 460. The memory device 400 can be employed, for example, in a first system, which can be, but is not limited to, an enterprise server system. In the recycle mode, the data in the at least one memory bank 420 is communicated to another chip (such as an external memory controller 492 or any processor that has a built-in memory control program) without passing through the bypassable internal memory chip controller 460.

In one embodiment, the memory device 400 can be configured to gather reliability data associated with operation of the at least one memory bank 420. In another embodiment, the memory device 400 can be configured to set the bypassable internal memory chip controller 460 in the bypass mode so that data is communicated directly between the control switch 420 and the set of input/output pins 480.

In one embodiment, the memory device 400 can be a flash memory device. The bypass mode can be a mode in which the at least one memory bank 420 is more resilient in terms of memory retention (i.e., provides greater memory retention) and/or bit-error rate (i.e., provides lesser bit error rate) than in the standard mode. In an example, the flash device can be a multi-level cell (MLC) device (i.e. each cell supports more than two threshold voltage levels), and in the bypass mode, at least one memory bank can be configured to use a single-level cell (SLC) mode (i.e. each cell supports two threshold voltage levels, an erased level and a programmed level). In the SLC mode, the flash cells can support higher memory retention and have lower bit-error rate than in an MLC mode, which is the original (standard) mode of operation of the MLC device.

In one embodiment, the memory device 400 can configure the at least one memory bank 420 during the recycle mode to perform at least one of:

(a) using a different error correction code on the at least one memory bank 420 in the recycle mode than an error correction code employed in the standard mode;
(b) storing a greater number of calibration cells compared to operation during the standard mode;
(c) reconfiguring a width of an interface to circumvent lack of communication through at least one broken pin on the memory device 400; and
(d) remapping pins based on detection of at least one broken pin in the memory device 400.

This recycle mode operation may, or may not, be employed in conjunction with a bypassable internal memory chip controller 460. In an embodiment in which the recycle mode operation is not employed with a bypassable internal memory chip controller 460, the bypassable internal memory chip controller 460 can be substituted with a non-bypassable internal memory chip controller (not shown), which is configured to provide an internal signal bypass paths based on an input, which can be provided by a tester 20, to the non-bypassable internal memory chip controller.

The memory device 400 may, or may not, be used for an original purpose for which the memory device 400 is initially manufactured. Once the memory device 400 is discarded for any reason discarded above, the memory device 400 can be employed as a discarded electronic device 10 as illustrated in FIG. 1 employing the method described in FIG. 2.

In one embodiment, the memory device 400 can be configured to be controlled by an external memory chip controller 530 while the control switch is in the other state.

In one embodiment, the control switch 440 is configured to be switchable through an input provided to the memory device 400 through the set of input/output pins 480.

In one embodiment, the memory device 400 can be employed for an original purpose which utilizes the bypassable internal memory chip controller 460 after manufacture and until a decision to discard is made. During the usage of the memory device 400 for the original purpose, the control switch 440 is in a state that allows the bypassable internal memory chip controller 460 to be in communication with the at least one memory bank 420 and the set of input/output pins 480. Upon making of the decision to discard the memory device 400 and a subsequent removal of the memory device 400 from the original system, the memory device 400 becomes a discarded electronic device 10 as described in FIG. 1.

The method of FIG. 2 can be employed to reuse the discarded electronic device 10 as a reclaimed electronic device 30. During the reclaim process of FIG. 2, the tester 20 in FIG. 1 can provide an input to change the state of the control switch 440 that bypasses the bypassable internal memory chip controller 460 and enable direct communication between the control switch 440 and the set of input/output pins 480. A dedicated control signal path 446 can be provided between the control switch 440 and the set of input/output pins 480 in order to enable transmission of the input from the tester 20 to the control switch 440.

Figure 5:
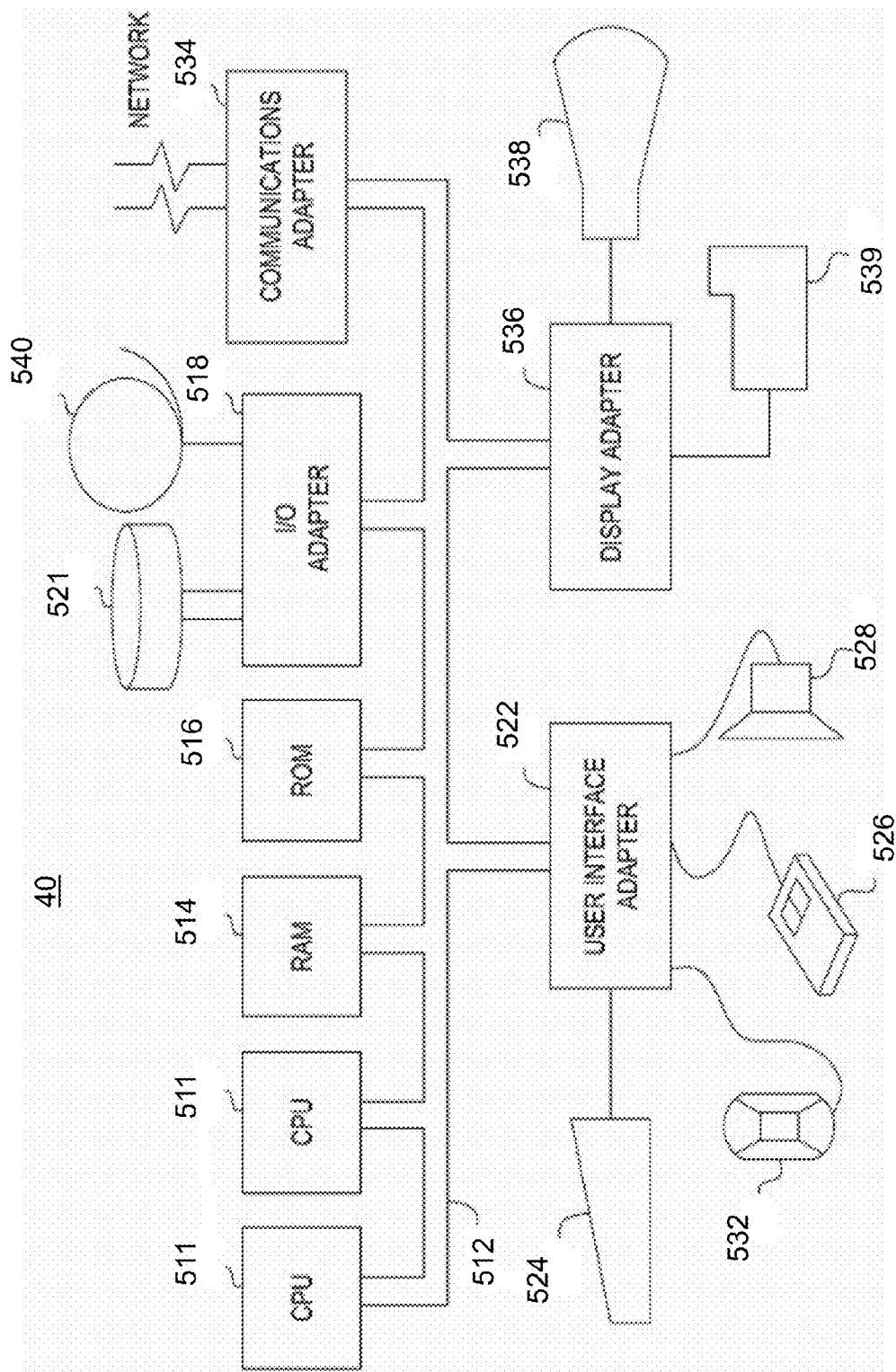
FIG. 5 illustrates an exemplary hardware configuration of a computing device that can be employed in the apparatus of FIG. 1.

FIG. 5 illustrates an exemplary hardware configuration of the computing device 40. The hardware configuration preferably has at least one processor or central processing unit (CPU) 511. The CPUs 511 are interconnected via a system bus 512 to a random access memory (RAM) 514, read-only memory (ROM) 516, input/output (I/O) adapter 518 (for connecting peripheral devices such as disk units 521 and tape drives 540 to the bus 512), user interface adapter 522 (for connecting a keyboard 524, mouse 526, speaker 528, microphone 532, and/or other user interface device to the bus 512), a communication adapter 534 for connecting the system 500 to a data processing network, the Internet, an Intranet, a local area network (LAN), etc., and a display adapter 536 for connecting the bus 512 to a display device 538 and/or printer 539 (e.g., a digital printer of the like).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with a system, apparatus, or device running an instruction.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with a system, apparatus, or device running an instruction.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may run entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which run via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which run on the computer or other programmable apparatus provide processes for implementing the functions/acts specified in the flowchart and/or block diagram block or blocks.

The drawing of the instant disclosure illustrate the architecture, functionality, and operation of possible implementations of systems, methods and computer program products according to various embodiments of the present invention. In this regard, each block in the flowchart or block diagrams may represent a module, segment, or portion of code, which comprises one or more operable instructions for implementing the specified logical function(s). It should also be noted that, in some alternative implementations, the functions noted in the block may occur out of the order noted in the figures. For example, two blocks shown in succession may, in fact, be run substantially concurrently, or the blocks may sometimes be run in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of determining an application for reusing a discarded electronic device, said method comprising the steps of:
    loading a discarded electronic device on a tester and testing said discarded electronic device for at least one performance parameter;
    determining, employing a computer device, a combination of an application that said tested discarded electronic device can be employed for, and a device operating method that enhances at least one aspect of performance of said tested discarded electronic device during use for said application;
    providing to said computer device at least one data input that defines a range of performance specification for at least one application, wherein said computer device identifies said combination from among a group of applications including said at least one application; and
    providing an output including said tested discarded electronic device as a reclaimed electronic device and information identifying said combination.

2. The method of claim 1, further comprising selecting said device operating method from a plurality of device operating methods that are compatible with use of said tested discarded electronic device, wherein said computer device performs said selecting based on projected performance enhancement that is estimated to result from each of said plurality of device operating methods that can be applied to said tested discarded electronic device.

3. The method of claim 1, wherein said step of determining of said combination comprises comparing test data generated from said discarded electronic device for said at least one performance parameter with contents of a database loaded onto, or accessed by, said computer device, wherein said database includes information identifying at least one application for a device type of said device and a corresponding requirement for said at least one performance parameter.

4. The method of claim 1, wherein said discarded electronic device is a discarded memory device, and said at least one performance parameter includes at least one of:
    a remaining lifetime of said discarded memory device;
    a retention time of said discarded memory device;
    a response time of said discarded memory device;
    an error rate of said discarded memory device;
    a total number, or a fraction of, failed memory blocks in said discarded memory device; and
    functionality of physical components in said discarded memory device.

5. The method of claim 1, wherein said device operating method includes at least one of an encoding method for storing data in said reclaimed electronic device and a decoding method for retrieving data stored in said reclaimed electronic device.

6. The method of claim 5, wherein said device operating method includes a set of enabling methods comprising:
    a first method for encoding data to be stored in said tested discarded electronic device;
    a second method for storing said encoded data in said tested discarded electronic device;
    a third method for retrieving said stored encoded data from said tested discarded electronic device; and
    a fourth method for decoding said retrieved encoded data.

7. The method of claim 1, further comprising:
    identifying another device that can be employed in conjunction with said determined combination such that said another device and said tested discarded electronic device are in communication with each other; and
    providing a physical unit of said another device or an instruction to obtain and to use a physical unit of said another device as a part of said output.

8. The method of claim 7, wherein said tested discarded electronic device is a memory device, said device operating method includes an encoding method, and said another device is a memory chip controller compatible with said encoding method in said determined combination.

9. An apparatus for identifying an application for using a tested electronic device, said apparatus comprising:
- a tester configured to load an electronic device and to test said loaded electronic device for at least one performance parameter;
- a computer device configured to determine a combination of an application that said loaded and tested electronic device can be employed for and a device operating method that enhances at least one aspect of performance of said tested loaded electronic device during use for said application; and
- a means for storing information identifying said loaded and tested electronic device as a reclaimed electronic device and information identifying said combination, wherein said computer device is configured to select said device operating method from a plurality coding methods compatible with use in said loaded and tested electronic device, and said computer device is configured to make said selection based on projected performance enhancement that is estimated to result from each of said plurality of encoding methods that can be applied to said loaded and tested electronic device.

10. The apparatus of claim 9, wherein said computer device is configured to identify said combination by comparing test data generated from said loaded and tested electronic device for said at least one performance parameter with contents of a database loaded onto, or accessed by, said computer device, wherein said database includes information identifying at least one application for a device type of said device and a corresponding requirement for said at least one performance parameter.

11. The apparatus of claim 9, wherein said tester is configured to test a memory device, wherein said tester is configured to employ, as said at least one performance parameter, at least one parameter selected from:
- a remaining lifetime of said loaded and tested memory device;
- a retention time of said loaded and tested memory device;
- a response time of said loaded and tested memory device;
- an error rate of said loaded and tested memory device;
- a total number, or a fraction of, failed memory blocks in said loaded and tested memory device; and
- functionality of physical components in said loaded and tested memory device.

12. The apparatus of claim 9, wherein said device operating method in said determined combination includes:
- a first method for encoding data to be stored in said loaded and tested electronic device;
- a second method for storing said encoded data in said loaded and tested electronic device;
- a third method for retrieving said stored encoded data from said loaded and tested electronic device; and
- a fourth method for decoding said retrieved encoded data.

13. The apparatus of claim 9, wherein said computer device is configured to receive, as an external input, at least one data input that defines a range of performance specification for at least one application, and said computer device is configured to identify said combination from among a group of applications including said at least one application.

14. The apparatus of claim 9, wherein said computer device is configured:
- to identify another device that can be employed in conjunction with said determined combination such that said another device and said loaded and tested electronic device are in communication with each other; and
- to store, or to communicate to another computer device, information on an identity of said identified another device.

15. The apparatus of claim 14, wherein said tester is configured to test memory devices, and said computer device is configured to identify, as said another device, a memory chip controller compatible with said encoding method in said determined combination.

16. A memory device comprising at least one memory bank including an array of memory cells, wherein said memory device is configured to operate in at least two operational modes including a standard mode in which data in said at least one memory bank is communicated to another chip through an internal memory chip controller and a recycle mode in which the data in said at least one memory bank is communicated to another chip without passing through said internal memory chip controller, wherein said memory device is configured to perform at least one of:
- gathering reliability data associated with operation of said at least one memory bank; and
- setting said internal memory chip controller in a bypass mode.

17. The memory device of claim 16, wherein said memory device is configured to perform at least one of:
- using a different error correction code on said at least one memory bank in said recycle mode than an error correction code employed in said standard mode;
- storing a greater number of calibration cells compared to operation during said standard mode;
- reconfiguring a width of an interface to circumvent lack of communication through at least one broken pin on said memory device; and
- remapping pins based on detection of at least one broken pin in said memory device.

18. A memory device comprising at least one memory bank including an array of memory cells, wherein said memory device is configured to operate in at least two operational modes including a standard mode in which data in said at least one memory bank is communicated to another chip through an internal memory chip controller and a recycle mode in which the data in said at least one memory bank is communicated to another chip without passing through said internal memory chip controller, wherein said memory device is a flash memory device, and said recycle mode has at least one of greater memory retention and lesser bit error rate than in said standard mode.

19. The memory device of claim 18, wherein said memory device is configured to perform at least one of:
- gathering reliability data associated with operation of said at least one memory bank; and
- setting said internal memory chip controller in a bypass mode.

20. The memory device of claim 18, wherein said memory device is configured to perform at least one of:
- using a different error correction code on said at least one memory bank in said recycle mode than an error correction code employed in said standard mode;
- storing a greater number of calibration cells compared to operation during said standard mode;
- reconfiguring a width of an interface to circumvent lack of communication through at least one broken pin on said memory device; and
- remapping pins based on detection of at least one broken pin in said memory device.

* * * * *